United States Patent
Pike

(10) Patent No.: US 6,281,130 B1
(45) Date of Patent: Aug. 28, 2001

(54) METHOD FOR DEVELOPING ULTRA-THIN RESIST FILMS

(75) Inventor: Christopher L. Pike, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 15 days.

(21) Appl. No.: 09/596,178

(22) Filed: Jun. 16, 2000

(51) Int. Cl.[7] ............... M01L 21/302; M01L 21/469
(52) U.S. Cl. ............... 438/693; 438/694; 438/747; 438/757; 438/763; 438/970
(58) Field of Search ............... 438/693, 694, 438/747, 757, 763, 970

(56) References Cited

U.S. PATENT DOCUMENTS

| | | | |
|---|---|---|---|
| 5,015,177 | * | 5/1991 | Iwata ............... 432/121 |
| 5,164,286 | * | 11/1992 | Blakeney et al. ............... 430/331 |
| 5,223,377 | * | 6/1993 | Samarakone et al. ............... 430/330 |
| 5,328,806 | * | 7/1994 | Toukhy ............... 430/286 |
| 5,667,922 | * | 9/1997 | Martiska et al. ............... 430/9 |
| 5,897,982 | * | 4/1999 | Shibata et al. ............... 430/311 |
| 5,962,196 | * | 10/1999 | Das et al. ............... 430/330 |
| 5,976,620 | * | 11/1999 | Sanada et al. ............... 427/240 |
| 6,051,358 | * | 4/2000 | Zampini et al. ............... 430/192 |
| 6,090,534 | * | 7/2000 | Costigan et al. ............... 430/229 |
| 6,132,940 | * | 10/2000 | Mih et al. ............... 430/312 |

* cited by examiner

*Primary Examiner*—Michael Lebentritt
(74) *Attorney, Agent, or Firm*—Davis Chin

(57) ABSTRACT

There is provided a method of applying a developing liquid onto a semiconductor wafer substrate having a UTR film thereon so as to minimize unexposed film thickness loss during development. This is achieved by applying the developing liquid from a developer nozzle which is off-set from the central position of the wafer substrate. The developing liquid is allowed to contact the wafer substrate for less than 10 seconds. As a result, there is overcome the problems of unexposed film thickness loss and critical dimension variations due to the developer nozzle effects.

1 Claim, 1 Drawing Sheet

METHOD FOR DEVELOPING ULTRA-THIN RESIST FILMS

BACKGROUND OF THE INVENTION

This invention relates generally to manufacturing processes for fabricating semiconductor integrated circuit devices. More particularly, it relates to an improved method of applying a developer onto a semiconductor wafer substrate having a ultra-thin resist film coating thereon so as to minimize unexposed film thickness loss during development.

As is generally known to those in the semiconductor industries, there is a continuing trend of manufacturing semiconductor integrated circuits with higher and higher densities on a smaller chip area. As a consequence of this desire for large scale integration, this has led to a continued shrinking of the circuit dimensions and features of the devices so as to reduce manufacturing costs and to improve circuit functionality. The ability to reduce the size structures such as shorter gate lengths in field-effect transistors is driven by lithographic technology which is, in turn, dependent upon the wavelength of light used to expose the photoresist. Currently, optical steppers expose the photoresist using light having a wavelength of 248 nm is widely used in manufacturing, but a radiation having a wavelength of 193 nm is being experimented in research and development laboratories. Further, the next generation lithographic technologies will in all likelihood progress toward a radiation having a wavelength of 157 nm and even shorter wavelengths, such as those used in Extreme Ultra-Violet (EUV) lithography (≈13nm).

As the wavelength of the radiation decreases, such classic image exposure techniques cannot be used to satisfactorily generate the pattern linewidths in the photoresist of greater than 0.25 $\mu$m (2500 Å). This is due to the fact that the organic-based photoresist materials will become increasingly opaque to the radiation. In order to overcome this drawback, there has been developed in recent years the use of ultra-thin resist (UTR) coatings in order to maintain the desired characteristics of the masked photoresist structures (e.g., near vertical sidewalls for the resist profiles, maximum exposure/focus latitude). In the current state-of-the-art, integrated circuit manufacturers have been using in the resist process a resist coating having a standard photoresist thickness of more than 0.5 $\mu$m (5,000 Å) for 248 $\mu$m lithography and 0.4 $\mu$m (4,000 Å) for 193 $\mu$m lithography. Thus, a resist coating having an UTR thickness is considered to be resist films of less than 0.25 $\mu$m (2500 Å) in thickness.

However, the development of ultra-thin resist coating is not without any problems due to the fact of the inherent thinness of the resist coating. For positive photoresist, the unexposed areas of the resist coating are insoluble and the exposed areas thereof are dissolved away when the substrate is immersed in an alkaline developing solution so as to produce a positive relief pattern on the substrate. Unfortunately, some of the resist coating, which is not exposed, is typically also dissolved during the development process. This is referred to sometimes as the "unexposed film thickness loss" or UFTL.

The loss of resist coating during the development process typically does not create any problems for the standard photoresist thickness of more than 5,000 Å. For example, the loss of 150 Å for the standard photoresist thickness amounts only to 3% of the total thickness. On the other hand, the loss of 150 Å for the Ultra-Thin Resist (UTR) coating having a thickness of, for instance, 1500 Å would be a serious problem since this would amount to 10% of the total thickness. Such a large percentage loss can adversely affect the subsequent etching processes in which the resist acts as a mask, where the selectivity between the resist and a device layer (film) to be etched is low.

Another problem encountered during the development process for UTR films is that they are more susceptible to critical dimension (CD) variations caused by the location of the developer nozzle. In particular, where a developing solution is dispensed onto the central portion of the substrate surface, the developing solution is then distributed on the substrate surface from the central position to the peripheral position by spinning. It is generally known that the impact point of the stream(s) of developing solution with the resist accelerates development locally. For the standard thickness photoresist coatings, this effect can be tolerated. However, for the UTR film coatings, they cannot be tolerated due to their inherent thinness.

Accordingly, there has arisen a need of providing a way of applying a developer onto a semiconductor wafer substrate having a ultra-thin resist film coating thereon so as to minimize unexposed film thickness loss during development. This is accomplished in the present invention by applying the developing liquid from a developer nozzle which is off-set from the central portion of the wafer substrate and by allowing the developing liquid to contact the wafer substrate for less than 10 seconds.

SUMMARY OF THE INVENTION

Accordingly, it is a general object of the present invention to provide an improved method of applying a developing liquid onto a semiconductor wafer substrate having a ultra-thin film thereon.

It is an object of the present invention to provide a method of applying a developing liquid onto a semiconductor wafer substrate having a ultra-thin film thereon so as to minimize unexposed film thickness loss during development.

It is another object of the present invention to provide a method of applying a developing liquid onto a semiconductor wafer substrate having a ultra-thin resist film thereon so as to minimize nozzle induced critical dimension variations in the films during development.

It is still another object of the present invention to provide a method of applying a developing liquid onto a semiconductor wafer substrate having a ultra-thin film thereon which includes applying the developing liquid from a developer nozzle which is off-set from the central position of the wafer substrate.

In a preferred embodiment of the present invention, there is provided a method of applying a developing liquid onto a semiconductor wafer substrate having a ultra-thin resist film thereon so as to minimize unexposed film thickness loss during development. The development liquid is applied onto the semiconductor wafer substrate having the ultra-thin film thereon while spinning the wafer substrate at a rotational speed of 100 to 1,500 r.p.m. for 0.5 to 5 seconds from a developer nozzle off-set from the central position of the wafer substrate. The developing liquid is applied continuously onto the wafer substrate while decreasing the rotational speed to less than 100 r.p.m. for 1 second. The developing liquid is allowed to contact the wafer substrate for less than 10 seconds. Then, the liquid developer is rinsed off, and the wafer substrate is spun dry.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
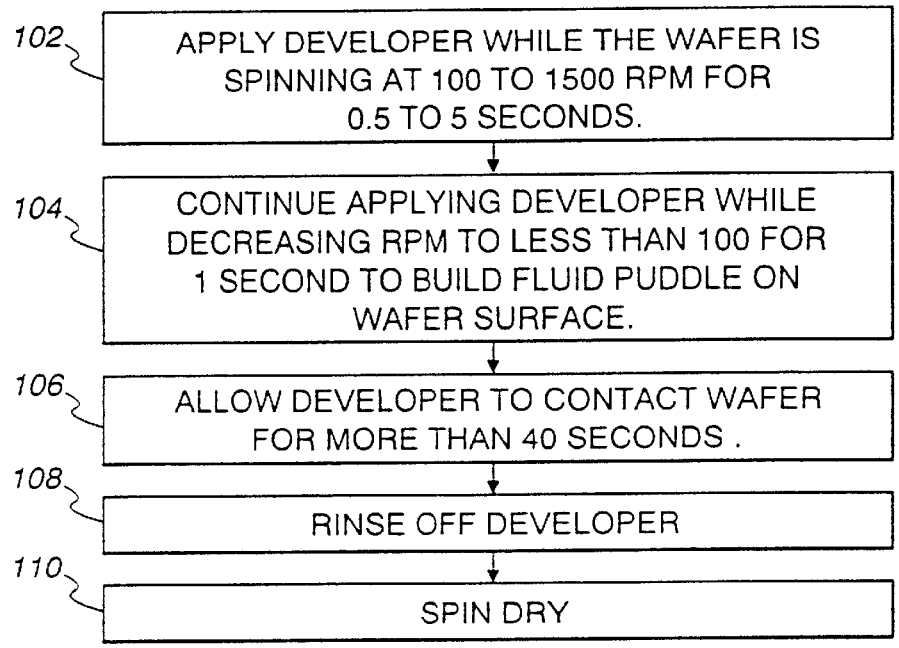
FIG. 1 is a process flow of a development procedure in accordance with standard developing techniques.
Figure 2:
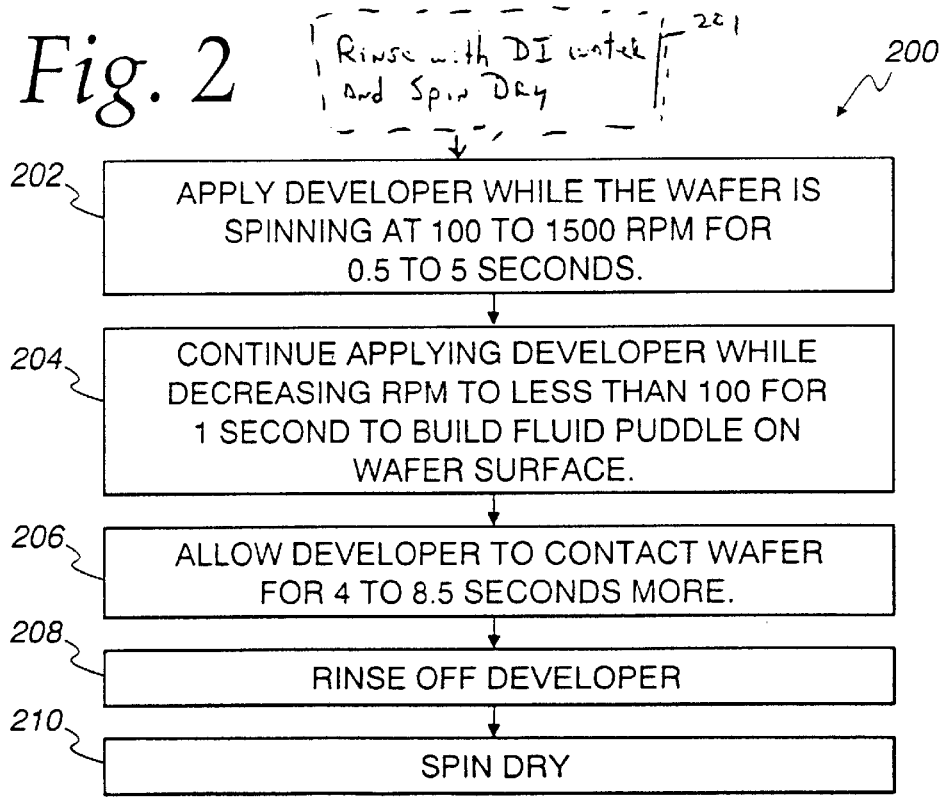
FIG. 2 is a process flow of a developing method for a UTR film coating, as taught in accordance with the principles of the present invention.

As a background and in order to assist in understanding the present invention, a conventional development procedure for applying a developer onto a semiconductor substrate having the standard thickness resist coating (greater than 4,000 Åthereon) will be initially described with reference to a process flow 100 of FIG. 1. As can be seen, after the wafer substrate has been coated with a photoresist having a final thickness of greater than 4,000 Å and subjected to pre-baking and post-baking treatments and exposed to UV light with a predetermined pattern, in a first development step 102 a developing liquid or solution is applied onto the surface of the wafer substrate while it is still spinning at a rotational speed in the range of 100 to 1,500 r.p.m. for between 0.5 to 5 seconds. As previously pointed out, the developing liquid is generally dispensed from a nozzle onto the central portion of the wafer substrate. The spinning serves to spread the developing liquid over the surface of the wafer substrate from the central portion to the peripheral portion thereof.

Then, in the step 104 the developing liquid is continued to be applied while the rotational speed of the wafer substrate is slowed down or decreased to the speed of less than 100 r.p.m. for 1 second. This step 104 allows a fluid puddle to be built up atop the surface of the wafer substrate. Next, in the step 106 the developing liquid is turned off but it is allowed to contact the wafer substrate for more than 40 seconds. Thereafter, the developing liquid is washed out by a rinsing liquid in the step 108. After the developing liquid has been rinsed off, in the step 110 the wafer substrate is spun so as to dry the developing liquid in order to complete the development process.

However, when these conventional development procedures were applied to a wafer substrate having a UTR film with a final thickness of less than 2,500 Å, it was observed that there was exhibited a substantial amount of unexposed film thickness loss (UFTL). Further, there was found to be relatively large critical dimension (CD) variations on the UTR films during the development process. It has been discovered by the inventors of the present invention that by performing the application of the developing liquid while the wafer substrate is still spinning at a rotational speed between 100 and 1,500 r.p.m. with the developer nozzle being off-set from the central position the UFTL could be minimized as well as minimizing the CD variations on the UTR films during development.

The instant invention will now be described in detail with reference to the process flow 200 as taught in accordance with the principles of the present invention. As can be seen, after the wafer substrate has been coated with a UTR coating having a final thickness of less than 2,500 Å, subjected to pre-baking and post-baking treatments, and exposed to UV light, in a first development step 202 a developing liquid or solution is applied onto the surface of the wafer substrate while it is still spinning at a rotational speed in the range of 100 to 1,500 r.p.m. for 0.5 to 5 seconds. Unlike the prior art of FIG. 1 in which the developer nozzle (not shown) is centrally positioned over the wafer substrate, the present developer nozzle is off-set from either side of the center position. The distance of off-set from the center of the wafer substrate is approximately between 1 mm to 8 mm. This serves to minimize the CD variations caused by the developer nozzle.

After the UTR coated substrate has been uniquely applied with the developing solution, in the step 204 the developing liquid is then continued to be applied while the rotational speed of the wafer substrate is slowed down or decreased to the speed of less than 100 r.p.m. for 1 second. This step 204 allows a fluid puddle to be built up atop the surface of the wafer substrate. Next, in the step 206 the developing liquid is turned off but it is allowed to contact the wafer substrate for less than 10 seconds. Preferably, the contact time is about 4 to 8.5 seconds. Thereafter, the developing liquid is washed out by a rinsing liquid in the step 208. After the developing liquid has been rinsed off, in the step 210 the wafer substrate is spun so as to dry the developing liquid in order to complete the development process.

In another aspect of the development process of the present invention, prior to the unique development application step 202, the UTR coated substrate may be optionally rinsed with de-ionized water and spun dry so as to wash away any anti-reflective materials which may have been left on top of the UTR coated substrate. This is shown in the step 201 which is performed just before where the developer is applied in the step 202.

From the foregoing detailed description, it can thus be seen that the present invention provides a method of applying a developing liquid onto a semiconductor wafer substrate having a ultra-thin film thereon so as to minimize UFTL during development. This is achieved by applying the developing liquid from a developer nozzle which is off-set from the central position of the wafer substrate. This also serves to minimize the critical dimension variations in the UTR films during development.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of applying a developing liquid onto a semiconductor wafer substrate having a UTR film thereon so as to minimize unexposed film thickness loss during development, said method comprising the steps of:

rinsing with de-ionized water the wafer substrate having the UTR film thereon and spinning dry the same prior to the step of applying the developing liquid so as to wash away any anti-reflective materials;

applying a developing liquid onto a semiconductor wafer substrate having a UTR film thereon while spinning the wafer substrate at a rotational speed of 100 to 1,500 r.p.m. for 0.5 to 5 seconds from a developer nozzle off-set from the central position of the wafer substrate;

the developer nozzle being off-set from either side of the central position of the wafer substrate by approximately 1 mm to 8 mm;

applying continuously the developing liquid onto the wafer substrate while decreasing the rotational speed to less than 100 r.p.m. for 1 second;

allowing the developing liquid to contact the wafer substrate for about 4 to 8.5 seconds;

rinsing off the developing liquid; and spinning dry the wafer substrate.

* * * * *

UNITED STATES PATENT AND TRADEMARK OFFICE
CERTIFICATE OF CORRECTION

PATENT NO. : 6,281,130 B1
DATED : August 28, 2001
INVENTOR(S) : Christopher L. Pike It is certified that error appears in the above-identified patent and that said Letters Patent is hereby corrected as shown below:

Column 1,
Line 46, change "248 µm" to -- 248 nm --.
Line 47, change "193 µm" to -- 193 nm --.
Line 64, change "Åfor" to -- Å for --.
Line 66, change "Åfor" to -- Å for --.
Line 67, change "Åwould" to -- Å would --.

Column 3,
Line 16, change "Åthereon" to -- Å thereon --.
Line 19, change "Åand" to -- Å and --.

Signed and Sealed this

Sixteenth Day of April, 2002

Attest:

JAMES E. ROGAN
*Attesting Officer*   *Director of the United States Patent and Trademark Office*